(12) United States Patent
Hold

(10) Patent No.: US 7,688,668 B2
(45) Date of Patent: Mar. 30, 2010

(54) CONTROLLING POWER SUPPLY TO MEMORY CELLS

(75) Inventor: Betina Hold, El Dorado Hills, CA (US)

(73) Assignee: ARM Limited, Cambridge (GB)

( * ) Notice: Subject to any disclaimer, the term of this patent is extended or adjusted under 35 U.S.C. 154(b) by 119 days.

(21) Appl. No.: 11/987,266

(22) Filed: Nov. 28, 2007

(65) Prior Publication Data

US 2009/0135661 A1   May 28, 2009

(51) Int. Cl.
*G11C 7/00* (2006.01)
(52) U.S. Cl. ........................ 365/226; 365/154
(58) Field of Classification Search ................ 365/154, 365/226
See application file for complete search history.

(56) References Cited

U.S. PATENT DOCUMENTS

| 2007/0002617 | A1* | 1/2007 | Houston et al. | 365/185.07 |
| 2007/0274124 | A1* | 11/2007 | Otsuka | 365/154 |
| 2007/0291562 | A1* | 12/2007 | Joshi et al. | 365/201 |
| 2008/0037337 | A1* | 2/2008 | Suzuki et al. | 365/189.16 |

\* cited by examiner

*Primary Examiner*—Hoai V Ho
(74) *Attorney, Agent, or Firm*—Nixon & Vanderhye P.C.

(57) ABSTRACT

A semiconductor memory storage cell and a memory comprising an array of these storage cells is disclosed. The storage cell comprising: a feedback loop comprising two devices for storing opposite binary values; data input and output for inputting data to and outputting data from said two devices; and each of said two devices comprising a power source input, such that each device can be powered independently of the other.

15 Claims, 9 Drawing Sheets

|         | $V_{DD1}$ | $V_{DD2}$ |
|---------|-----------|-----------|
| write 1 | high      | low       |
| write 0 | low       | high      |
| read    | high      | high      |

FIG. 2

CONTROLLING POWER SUPPLY TO MEMORY CELLS

BACKGROUND OF THE INVENTION

1. Field of the Invention

The field of the invention relates to data processing and in particular to memory storage cells.

2. Description of the Prior Art

Memory storage cells formed from semiconductors in integrated circuits are known. They are conventionally formed of bistable circuits that can be flipped between one of two stable states. If the circuits are well balanced then they do not preferentially store either state. A well balanced cell that does not preferentially store a particular value will have the advantage of holding either value with approximately the same power loss and will be as easy to write a "one" to as it is to write a "zero". However, a potential drawback of such a cell is that on power up it is unknown which value will to be stored in these cells and there are circumstances where it would be advantageous to initialise a memory in a known state.

There is a continual demand to reduce the size and power consumption of such memory storage cells. However, with decreasing size, read and write operations which make conflicting demands, may no longer both be successful due to variable threshold voltages of the devices used caused by increasing process variations at the smaller geometries or technology nodes. This is particularly the case where a wide range of voltage, temperature or process limits are used. To extend the range of the cell and enable writes to be performed consistently a write assist signal has been introduced which is used to help flip the cell in cases where the high voltage rail VDD and pull up device hold the node at the input to the cell at too strong a value for the data input to be able to flip the cell to its new state.

One known write assist system uses two power supply rails connected by respective gates to each memory cell to be written. A first of these power supplies is used to power the memory cell in modes other than a write mode and utilises a relatively high supply voltage level. The second power supply has a lower voltage level and is used during write operations to power the memory cell. The lower supply voltage used during such write operations enables the memory cell to be more readily written. A disadvantage with this approach is that although it improves the writing of a zero and increases the pulldown speed for this write it slows the writing of the one. It also requires two separate power rails to be routed through the memory.

Another known approach to providing a write assist mechanism is using the memory cell with a gated power supply from a single source. When operating other than to perform a write, the memory cell is supplied with power through the gate. When it is desired to write to that memory cell, the gate isolates the memory cell from the power supply such that the memory cell is unpowered during the write operation. This makes it easier for a new data value to be written into the memory cell. Memory cells are not normally provided with individually controllable power supplies since this would consume a disadvantageous number of gates and reduce the memory density. Rather, a group of memory cells usually share a power supply line, which may be a virtual power supply line separated by a gate from a permanently powered power supply line in accordance with this technique. However, when multiple memory cells share a power supply in this way, all of these memory cells will be isolated from the power supply and be unpowered whilst one of the memory cells is being written. This will leave the unpowered memory cells vulnerable to data loss. This risk is increased when one considers manufacturing and process variations which can occur rendering individual memory cells particularly vulnerable to data loss when unpowered. This approach suffers from the disadvantage of potentially rendering a memory unreliable. Furthermore, as for the previous example it suffers from the disadvantage of improving the speed for writing a zero but slowing the writing of a one.

A further write assist method is disclosed in U.S. Ser. No. 11/392,961 the entire contents of which are incorporated herein by reference. In accordance with this technique a memory cell is provided with power via a power supply control circuit including at least two gates which are switched by a write assist signal to provide either a low resistance or high resistance path through the power supply control circuit. Thus, the memory cell is always powered and connected to the power supply, but when the high resistance path is in use during writing to the memory cell, then this will effectively weaken the power supply to the memory cell such that it is easier for a new data value being written into that memory cell, i.e. to change the state of the memory cell and overcome the inherent stability in the memory cell which tends to oppose changes in its state. Once again this suffers from the problem of increasing the speed of writing a zero, but decreasing performance for writing a one.

SUMMARY OF THE INVENTION

A first aspect of the present invention provides a semiconductor memory storage cell comprising: a feedback loop comprising two devices for storing opposite binary values; data input and output for inputting data to and outputting data from said two devices; each of said two devices comprising a power source input, such that each device can be powered independently of the other.

The present invention recognises that the problems that arise due to memory bit cells decreasing in size cannot all be addressed by simply varying the voltage level input to power the cell during a write. It recognises that individual control of the power supplied to the two separate devices forming the bit cell could be used to address the problems of the prior art far more effectively than simply controlling the power source input to both devices. Allowing the power line of each device to be individually controlled provides a cell which can be more readily adjusted such that the problems arising from the different corner cases can be individually addressed and thus, a cell which stores values securely and yet can be consistently written to and read from is provided.

Although the memory storage cell can be made up in a number of different ways as would be appreciated by a skilled person, in some embodiments, said semiconductor memory storage cell comprises a six transistor bit cell in which said two devices comprise a pair of back to back inverters each comprising two transistors, and said memory storage cell further comprises two access control transistors arranged to selectively isolate each of said devices from said data input and output.

The traditional six transistor bit cell is widely used for storing data and suffers from the problem of being unable to consistently write data values to the cell in circumstances where the cells are reduced in size and where the smaller process technology nodes suffer from yield limiting process variations. Providing the back to back inverters with individually controllable power supplies enables many of the problems that these cells traditionally face to be addressed. Furthermore, these cells have recently become flatter and flatter to reduce the capacitance and loading on the bitlines and they have consequently have become wider. In these circumstances it is the horizontal power line and word line and diffusion limited stacked devices that limit the height of the cell, while the vertical metal lines are no longer width limiters. Thus, there is space for an additional power line in the vertical direction. Embodiments of the present invention makes use of this geometry to supply an additional power line to each bit cell and uses the two power lines to power the two devices individually.

In some embodiments, said cell comprises two high voltage level power source inputs for receiving independently controllable voltage levels and a common low voltage power source input.

Although the two power inputs can receive separately controllable either high or low voltage levels, in preferred embodiments it is the high voltage level that is controllable. This is because the arrangement of many traditional memory bit cells means that the control of this high voltage level is the important one for addressing the write problems, in particular it causes a less detrimental reduction in noise margin due to its column based (vertical) control where RNM is affected and not SNM which allows for greater margins. (SNM is signal noise margin when the wordline is open, while RNM: is retention noise margin when the wordline is closed). Controlling the high voltage level differently for each device in a cell enables the cells to be set up to increase performance for both reads and writes and also for the writing of different values. It would be clear to a skilled person that if the memory cells were arranged differently then the control of the low voltage levels may become important.

A second aspect of the present invention provides a memory comprising an array of semi-conductor memory storage cells according to a first aspect of the present invention, said array further comprising power control circuitry for controlling power supplied to said two power inputs of each of said cells.

The memory storage cells according to embodiments of the present invention are generally used in arrays to form a memory. Power control circuitry can be associated with these arrays to control the power supplied to the two devices individually such that individual control of the two devices of a cell that is being addressed can be achieved and problems of the prior art addressed in this way.

In some embodiments, each of said cells comprise two high voltage level power source inputs and a single low level voltage power source input, said power control circuitry being adapted to independently control a high voltage level input to each of said two high voltage level power source inputs and to supply a low voltage input to said low voltage power source input.

In some embodiments, said power control circuitry comprises logic for supplying one of two values of a high voltage level to each of said two independently controllable high voltage level inputs, said two values comprising either a higher high voltage level or a lower high voltage level.

Although the power control circuitry can control the voltage levels input in a wide variety of ways, it is generally advantageous to provide two high voltage levels, a higher high voltage level which generally approximates to that of the power rail and a lower one which is supplied when it is advantageous that the device is not held at such a high voltage level.

In some embodiments, said array of cells comprises a plurality of columns and rows of cells, said memory further comprising two independently controllable high voltage tracks for each column, each controllable by said power control circuitry and each connecting to each cell in said column and a low voltage track for each row and connecting to each cell in said row.

The set up of an embodiment of the invention comprises a lay out having an array of cells with two separate high voltage tracks per column and a low voltage track per row. Power control circuitry controls the voltage level supplied to these such that the devices on the cells can receive different high voltage levels. Being able to control the high voltage level differently for each device in a cell enables the performance for both reads and writes to be improved. However, as the control is done per column when the voltage is lowered, it is lowered to the same device in all cells thus, all non-accessed cells are weakened. However, as the write performance for the cell that is accessed is increased the write takes less time and thus, the weakening of the cell by the reduction in the voltage of one of the high power rails occurs for less time than would be the case for a traditional write assist signal.

Although, the memory can take a number of forms, in some embodiments it comprises an SRAM memory array each row in said memory being separately addressable as a word.

SRAM memories formed from an array of 6T bit cells are particularly appropriate for the technique of embodiments of the present invention.

In some embodiments, said power control circuitry is responsive to a power up signal to provide a high voltage level signal to one of said power source inputs of each of said cells before the other one of said power source inputs, such that each cell is initialised to store a predetermined known value dependent upon which power source input received said high voltage level first.

The ability to provide separate power control to the two devices can be used to power up the two devices at slightly different times following power up or reset. This enables the memory cells to be initialised in a known state which can in some circumstances be very advantageous. This is particularly so for low power applications, where a memory can be initialised in a known state at power up and the millions of write cycles normally required to achieve this state can be avoided.

In some embodiments, said power control circuitry is responsive to a read data signal received at said memory to supply said higher high voltage level to each of said power source inputs of said cell being addressed.

The control of the power can be done not only in response to power up but also in response to the type of signal that is received by the memory. Thus, if a read signal is received it is advantageous if both devices receive the higher voltage as then it is easier for the values that they are storing to be output. Enabling control of the storage cell in response to the type of signal received provides a system that is extremely flexible and therefore able to address the problems associated with memory storage cells of the prior art.

In some embodiments, said power control circuitry is responsive to a write high value signal to supply to said cell being addressed, said higher high voltage level to said power source input powering said device storing and outputting said high value and to supply said lower high voltage level to said power source input powering said device storing and outputting said low value.

Further control of the power supply to the two devices not only in response to the type of data access request but also to the data that is being written means that the devices can individually be held at appropriate levels for the data that they are to receive not only enabling data to be consistently successfully written to the cells but also increasing the performance of such a write.

In some embodiments, said power control circuitry is responsive to a write low value signal to supply to said cell being addressed, said lower high voltage level to said power source input powering said device storing and outputting said low value and to supply said higher high voltage level to said power source input powering said device storing and outputting said high value.

When a data 0 is to be written then the two devices store opposite values to those that they stored for the 1. Thus, controlling the power supply to the devices in the opposite manner to that which was done for write of the data 1 produces an efficient and effective write.

In some embodiments, said power control circuitry comprises logic for connecting a high voltage level power supply to said power source input via a low resistance device to provide said higher high voltage level and for connecting a low voltage level power supply to said power source input via a low resistance device in parallel with a reverse biased diode connected to said high voltage power supply to supply said lower high voltage level.

The power control circuitry can be devised in a number of ways and may be produced using traditional gate controlled logic, alternatively said power control circuitry may comprise source controlled logic for providing said lower and higher high voltage levels to respective ones of said two devices.

Although, the power control circuitry can be formed from different devices arranged in different ways, a low area convenient way of producing such control circuit is to reduce the voltage level of the high voltage rail by dropping it across a reverse biased diode whose voltage drop is known.

In other embodiments, said power control circuitry comprises logic for connecting a high voltage level power supply to said power source input via a low resistance device to provide said higher high voltage level and for connecting said high voltage level power supply to said power source input via a higher resistance device to supply said lower high voltage level.

A third aspect of the present invention provides a memory storage cell comprising a pair of back to back inverters each of said inverters comprising a power source input such that a power supplied to each inverter can be independently controlled.

A fourth aspect of the present invention provides a method of writing data in an integrated circuit memory cell and reading data from said memory cell, said method comprising the steps of: connecting two power supply inputs via power supply control circuitry to said memory cell having two devices, such that a first device is controlled by said first power supply input and a second device by said second power supply input; independently controlling said two power supply inputs in response to receipt of data access signals.

The above, and other objects, features and advantages of this invention will be apparent from the following detailed description of illustrative embodiments which is to be read in connection with the accompanying drawings.

BRIEF DESCRIPTION OF THE DRAWINGS

FIG. 2 illustrates a table showing the values of the two high power rails of a memory cell during different read and write transactions;

DESCRIPTION OF THE PREFERRED EMBODIMENTS

Figure 1:
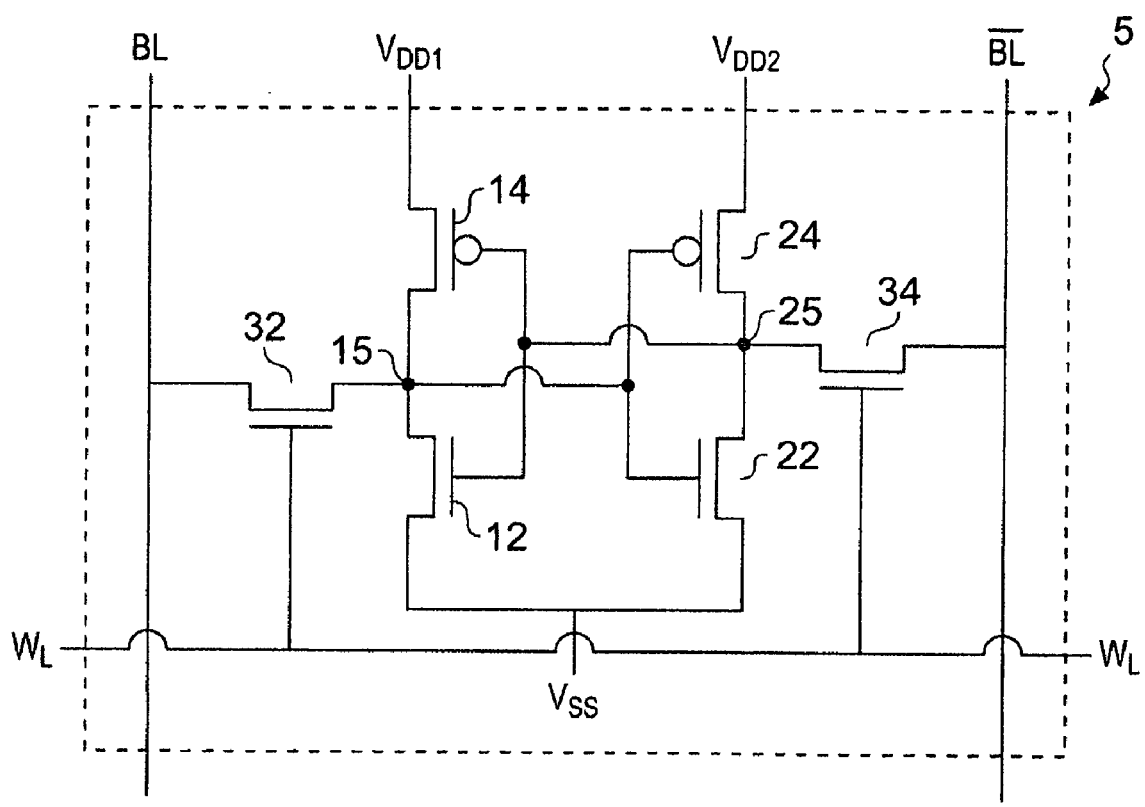
FIG. 1 illustrates a memory cell according to an embodiment of the present invention.

FIG. 1 illustrates a memory cell 5 according to an embodiment of the present invention. The memory cell 5 comprises a pair of cross-coupled inverters formed by transistors 12, 14, 22 and 24. Transistors 12 and 14 form a first device which is powered by VDD 1 while transistors 22 and 24 form a second device powered by VDD 2. These two devices have a common low voltage rail VSS.

The memory cell further comprises bit lines BL and a word line WL. The word line is connected to the gates of two access transistors 32 and 34 which when switched on by a signal on this word line provide a path between an input/output portion 15, 25 of the devices and the bit lines. Thus, under control of the word line the devices can be placed in data communication with the bit lines and data can be read in or written out from these devices.

As the two devices are a cross coupled pair if device 1, transistors 12 and 14 has a 1 at input/output port 15 then second device transistors 22, 24 will have a 0 at its output port 25. When in this state, the memory cell is considered to be storing a 1. If a 0 is present at point 15 then a 1 is present at point 25 and the memory cell is considered to be storing a 0. Thus, writing a 1 involves writing a 1 to node 15 and a zero to node 25, while writing a zero involves writing a 0 to node 15 and a 1 to node 25.

The memory cell 5 forms a bi-stable circuit that is stable either in a state where it stores a 1 and a 0 on the two devices or in a state where it stores a 0 and a 1. However with shrinking geometries it is known that the cell stability can be challenged and even corrupted by external voltage noise disturbances which are quantified as SNM or RNM, SNM being signal noise margin when the wordline is open, while RNM is retention noise margin when the wordline is closed.

On power up if the same voltage level is applied to VDD 1 and VDD 2 at the same time then the state that the memory cell will initialise in, is uncertain and in an array of memory cells a percentage will probably initialise in one state and the rest in the other state. It may be desirable to initialise a memory in a known state. By providing separately controllable power inputs to the memory cell, VDD1 and VDD2 embodiments of the present invention are able to power up one side of the cell before the other by supplying a voltage to one of VDD1 or VDD2 before the other. This means that the value that is stored in the memory cell following power up can be selected. This can be advantageous. For example, by storing known desired values the memory can be initialised in a particular state and the need to write data into the memory to achieve this state following power up can be avoided. Alternatively this method can be used to ensure that the values stored on power up are those that when the memory is not in use cause the lowest power loss.

The values of the voltage levels powering the two devices also affects their stability when storing data and how easy it is to read the data out of the devices and in fact write the data into them. Unfortunately, although a high voltage level on both VDD1 and VDD2 makes reading data values out of the cell easier, it can impede writing data values into it. Thus, it has always been difficult to provide optimal voltage levels for these devices while retaining consistent read and write capabilities. Embodiments of the present invention address this problem by providing individually controllable voltage levels to the two devices. In this way the voltage levels can be set to desired values depending on the function that the memory cell is to perform.

FIG. 2 shows a table indicating preferential values for the high voltage rails of the two devices in different circumstances. As can be seen from this table, when a 1 is required to be written into the device which would result in a 1 value being at point 15 and a 0 at point 25 then it is advantageous if VDD 1 is high and VDD 2 slightly lower. This is because inputting a 1 to the device involves setting point 25 to 0. If point 25 was previously 1 then depending on the size and conductivity of the transistor 24 it may be difficult to pull this node down to data 0. Changing the size and conductivity of the transistor 24 to enable this makes reading and writing data 0's more difficult. Thus, it has been found to be advantageous to lower VDD 2 when a 1 is being written which enables the system to pull node 25 down to 0 and enables the 1 to be written.

Similarly, when a 0 is being written to the device then node 15 should store a 0 and node 25 a 1. In order to facilitate the pulling down of node 15, from 1 to 0 without changing the size of transistor 14, it has been found convenient to lower VDD1 in response to detection of a write 0 request and in this way the 0 can be written consistently.

When reading it is advantageous if both VDD1 and VDD2 are high thus, in response to a read request these two values are kept high.

Figure 3:
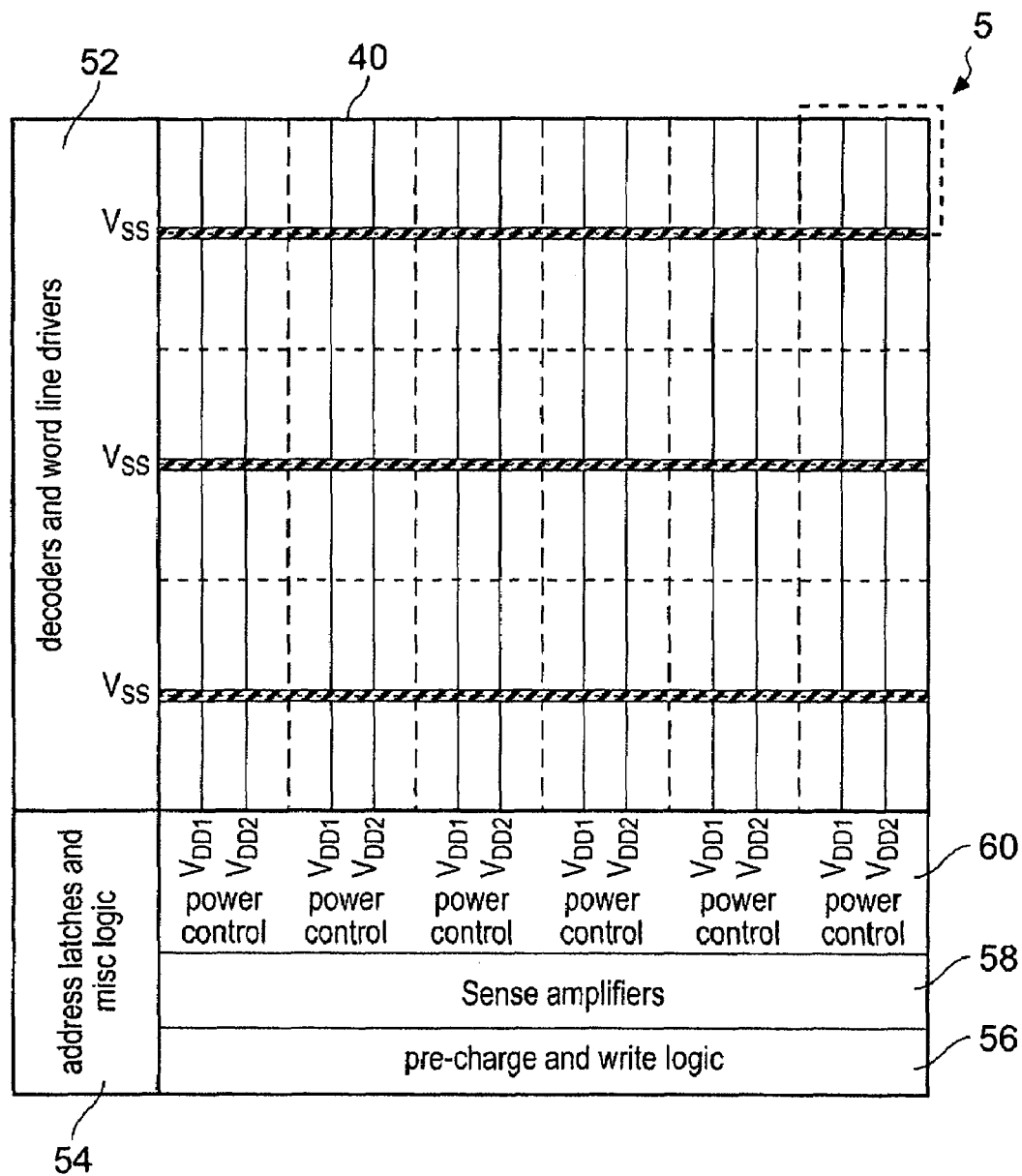
FIG. 3 illustrates a SRAM memory comprising an array of memory cells such as those shown in FIG. 1 and associated logic.

FIG. 3 shows a memory 40 comprising an array of memory cells 5, decoders and word line drivers 52, address latches and miscellaneous logic 54, pre-charge and write logic 56, amplifiers 58 and individual column power control circuitry 60. The memory 40 is arranged such that the low power rail VSS is supplied to the cells on a grid that runs between the rows such that each VSS track supplies two rows of cells. The VDD high power voltage line is supplied as two separate tracks to each column of cells and these two tracks have individual column power control circuitry 60.

Figure 4A:
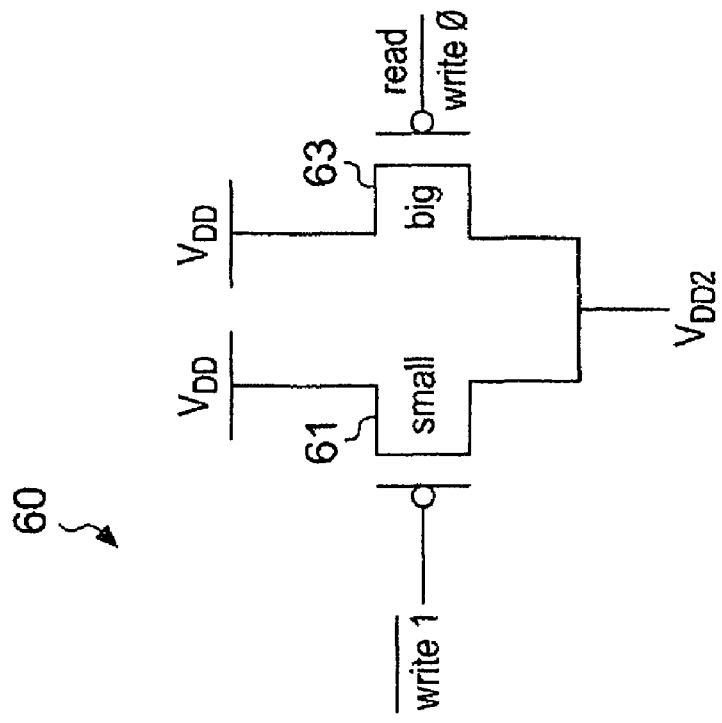
FIG. 4a illustrates power control circuitry for controlling the value of the input high voltage level to the memory cell.
Figure 4A:
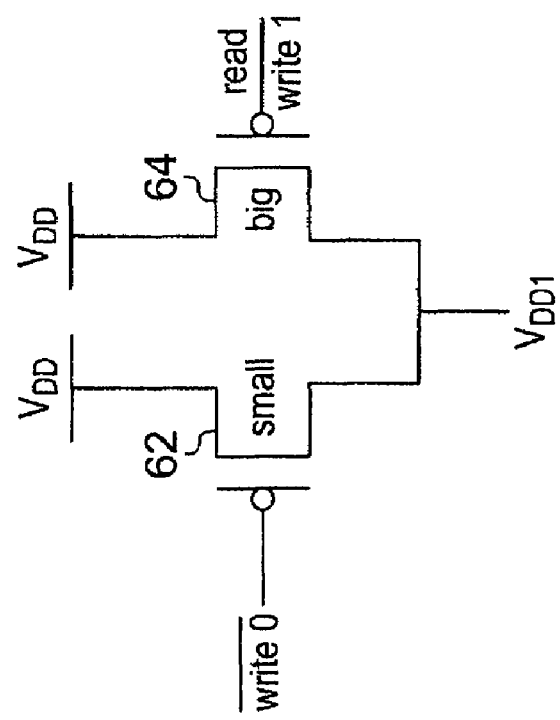

FIG. 4a shows power control circuitry 60 according to an embodiment of the present invention. It will be appreciated that the required power signals could be achieved in a number of ways and that the power circuitry shown in FIGS. 4a, 4b and in FIG. 5 are merely examples of possible ways to achieve a pattern of power supplies such as is shown in FIG. 2.

In FIG. 4a VDD1 is provided by pmos transistors 62 and 64. Transistor 62 is marked as a "small" transistor which means that it has a high resistance. This could be due to it having a small device size or a long length or the high resistance may be generated by arranging two devices in series. Transistor 64 is large and therefore has a small resistance. Transistor 62 is gate controlled by an inverted write 0 signal. Thus, when a write 0 is input a 1 is provided at this device's gate and it is switched on. As it has a high resistance the voltage provided at VDD1 is VDD minus the voltage drop across the device, which is considerable and thus, it is notably smaller than VDD. The other transistor 64 is gate controlled by a read and write 1 signal so that if there is a read or write 1 signal received this transistor is turned on and as it has a low resistance VDD1 approximates to VDD. Thus, VDD1 is high in respect of a read or write 1 signal and lower in respect of a write 0 signal.

VDD2 is generated by transistors 61 and 63. Transistor 61 is "small" while transistor 63 is "big". Transistor 61 is gate controlled by a write 1 signal. Thus, in response to a write 1 command this transistor is turned on and as transistor 61 has a high resistance VDD2 is notably less than VDD. In response to a read signal or a write 0 signal transistor 63 switches on. This is a low resistance device when it is on and thus, VDD2 approximates to VDD. Thus, VDD2 is high in respect of a read or write 0 signal and lower in respect of a write 1 signal.

Figure 4B:
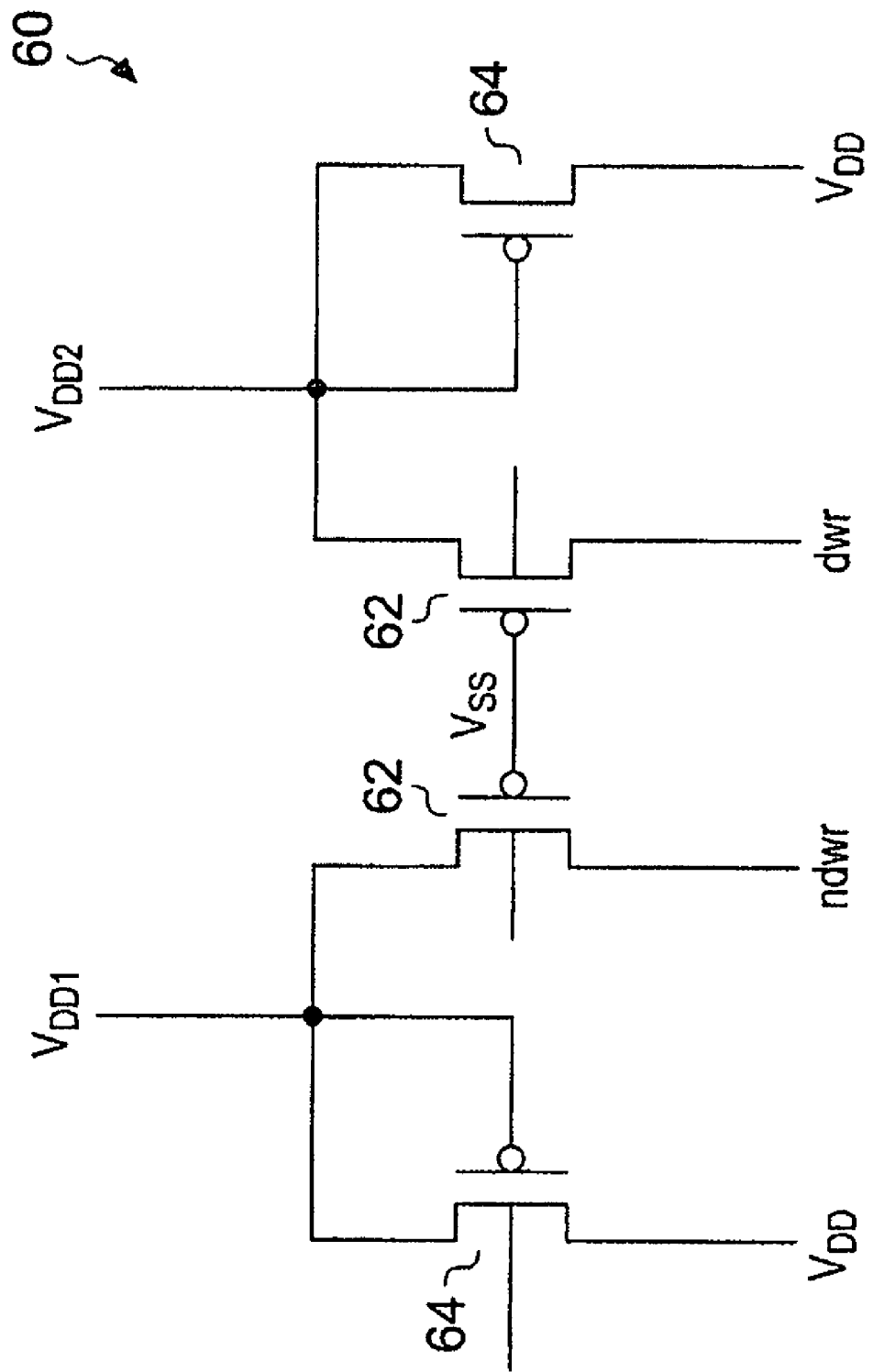
FIG. 4b illustrates similar source controlled power control circuitry for controlling the value of the input high voltage level to the memory cell.
Figure 5:
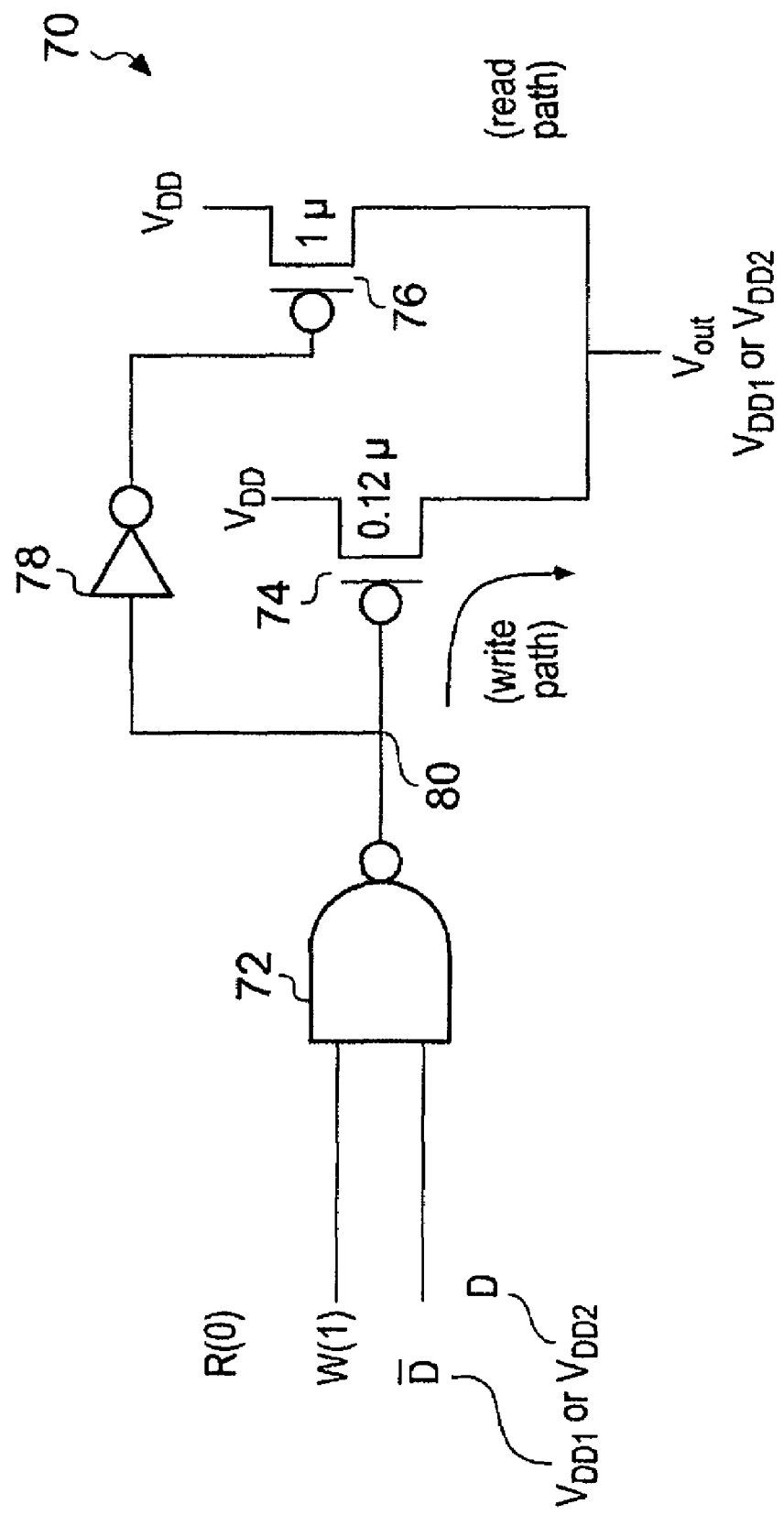
FIG. 5 illustrates the power control circuitry of an alternative embodiment of the present invention.

FIG. 4b shows a diffusion controlled power control circuitry similar to that of FIG. 4a where the source of each pmos device 62 is data controlled. In this embodiment transistors 62 have the data write signal dwr or its inverse ndwr applied to their source. This is similar to applying VDD or VSS as in FIG. 4a but means that the appropriate voltage is applied automatically by using the data signal itself. In this way a higher high voltage level or a lower high voltage level is output according to the value to be written. Thus, the devices are data controlled and output the appropriate values according to the table of FIG. 2 during write. During a read a high value is input to the source of both devices. Diode connected devices prevent the voltage from dropping beyond VDD minus a pmos Vt threshold.

FIG. 5 shows alternative power control circuitry according to another embodiment of the present invention. Power control circuitry in this embodiment comprises a NAND gate 72 which has two inputs, one that receives a write signal in the form of a 1 or a read signal in the form of a 0 and the other which receives either the data or the inverse of the data (depending on whether the device is being used to generate VDD1 or VDD2). By supplying a read signal of zero to one input of the NAND gate it is ensured that there is always a 1 output at node 80 in response to a read signal. A 1 signal at the output turns transistor 74 off and thus, this device is not functioning during a read. The one signal is inverted by inverter 78 and this turns turns transistor 76 on. Transistor 76 is a large transistor of the order of 1 micron and thus, has a low resistance and therefore when switched on outputs approximately VDD. Thus, in the case of a read VDD1 or VD 2 is set to be approximately VDD.

In the case of a write then NAND gate 72 plays a roll. If the data input line inputs a 1 (data=1) and the device is generating VDD2 or if the data is 0 and the device is generating VDD 1 then NAND gate 72 outputs a 0 and transistor 74 is switched on and transistor 76 is switched off. Transistor 74 then conducts VDD to the output. However, as this is a small device there is a significant voltage drop across this device and thus the voltage output is significantly lower than VDD. If the data input line inputs a 0 then transistor 74 is switched off and transistor 76 is switched on and in this case the output voltage is approximating to VDD as for the case of a read. Thus, this power control circuitry can vary the output voltage level in response to the input signal being either a read or write and in response to the data being written.

Figure 6A:
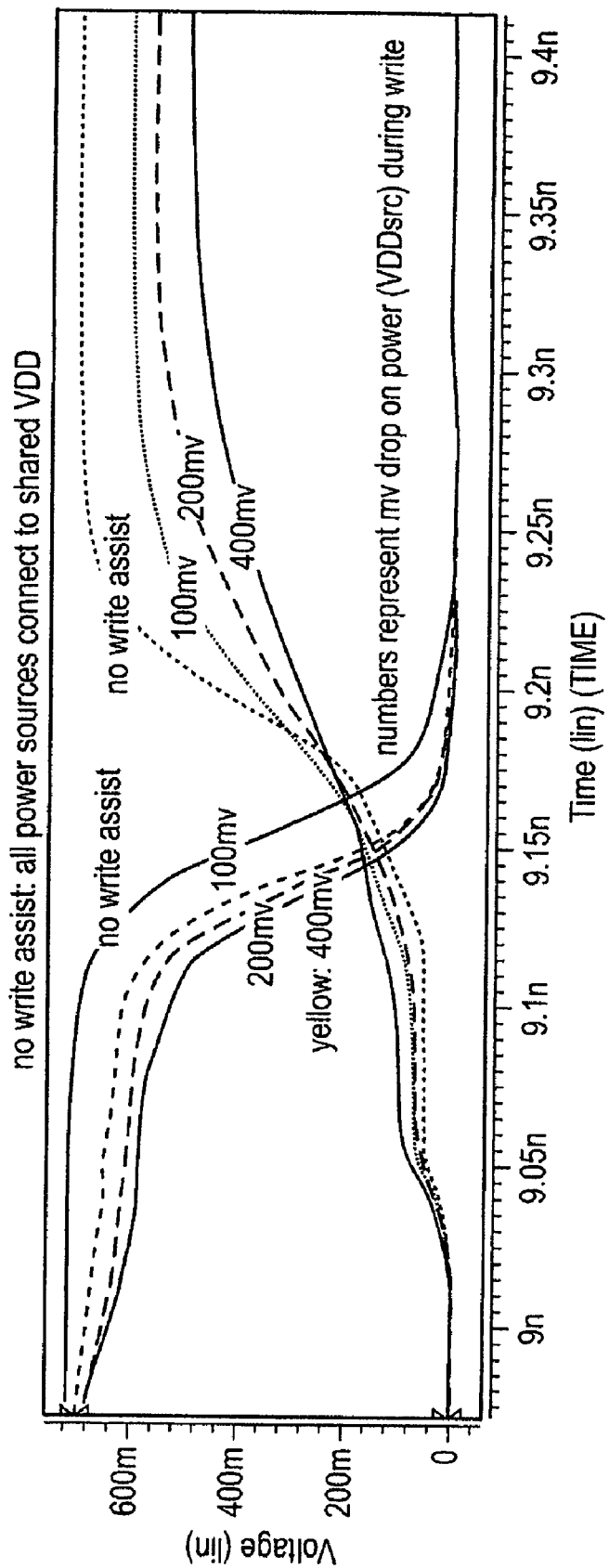
FIG. 6a-6c show timing diagrams of memory cells of the prior art and those of an embodiment of the present invention changing state.
Figure 6B:
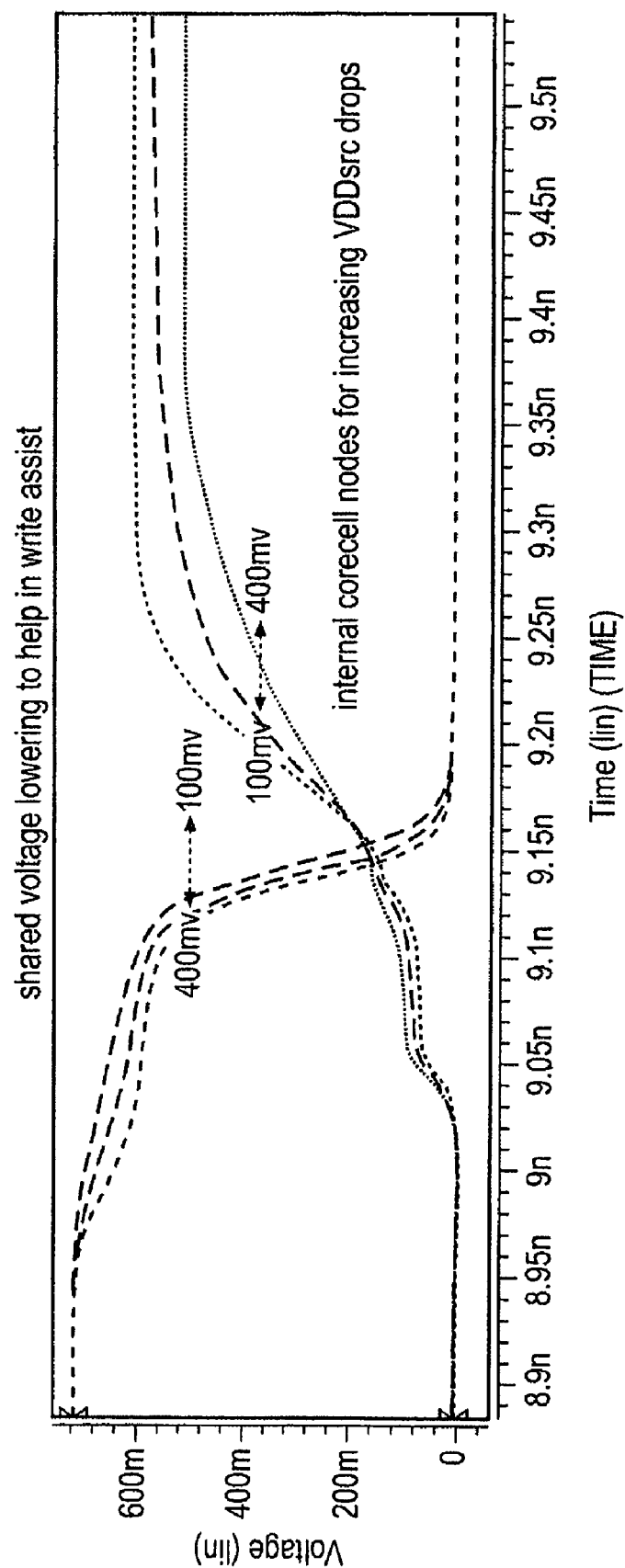

FIG. 6 shows timing diagrams of different memory cells flipping state. FIGS. 6a and 6b show a memory cell according to the prior art, wherein both devices of the bi-stable circuit are connected to a common VDD. FIG. 6b shows a system according to the prior art, wherein the voltage level of both devices is lowered by a write assist signal to help enable the write. In FIG. 6a the lines marked "no write assist" show the corecell flipping with no write assist. If we lower the shared power driving the source node of the corecell to values of 100, 200, 400 mv, then the corecell can be written faster as can be seen by the 100, 200 and 400 mv lines which fall to 0 faster than the "no write assist" line. However the alternative side of the corecell is being pulled up slower as can be seen by the 100, 200 mv, 400 mv lines which are rising slower than the "no write assist" yellow line.

FIG. 6b highlights the lowering of the shared voltage driving the two devices and shows how lowering this voltage help write the 0's faster, but the ones' slower.

Figure 6C:
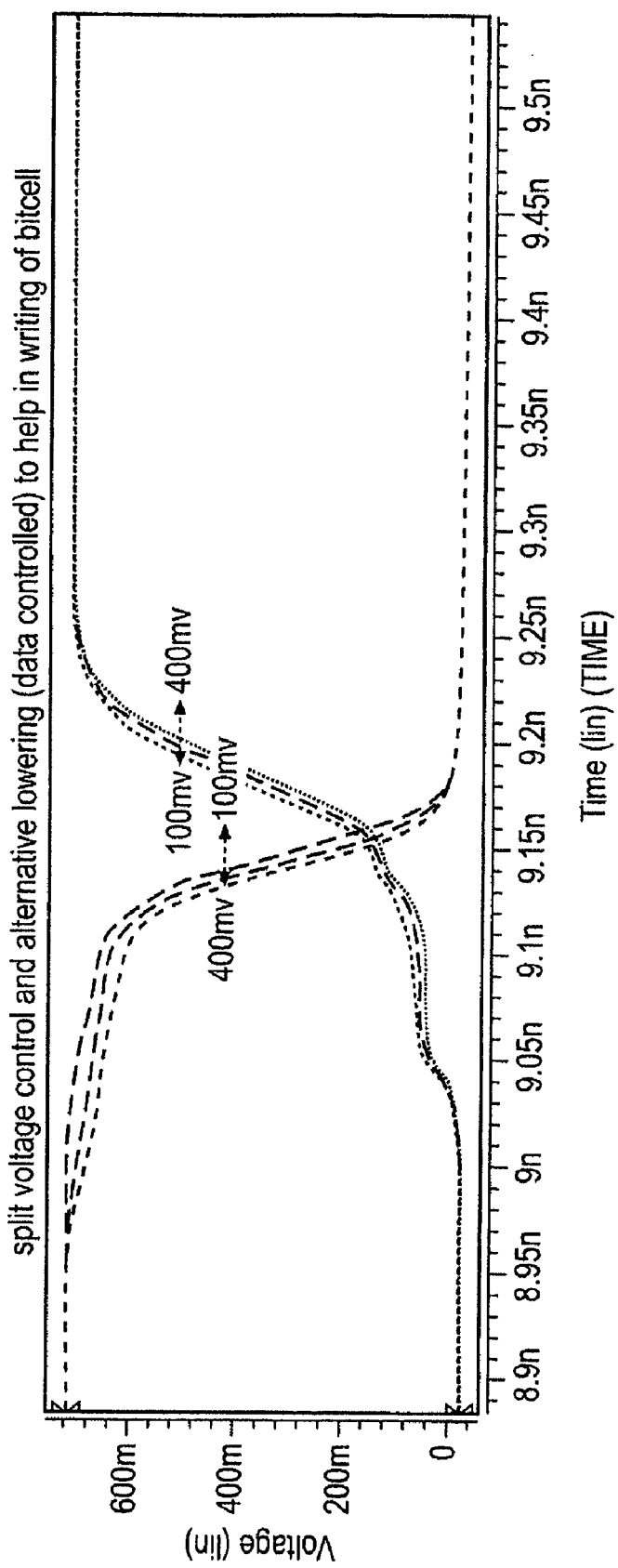

FIG. 6c shows a timing diagram of a memory cell according to an embodiment of the present invention where there is split voltage control to the two devices and data controlled voltage lowering to help in writing to the memory cell. As can be seen the split voltage on the two pmos devices is now individually controlled and the falling internal node is faster than with no write assist and the rising internal node is faster than the rising with write assist of the known previous approach of having a shared VDD for both devices that can be lowered. Thus, timing advantages of embodiments of the present invention as compared to devices of the prior art can be clearly seen from this Figure.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A memory comprising an array of semiconductor memory storage cells, each cell comprising:
   a feedback loop comprising two devices for storing opposite binary values;
   data input and output for inputting data to and outputting data from said two devices;
   each of said two devices comprising a power source input, such that each device can be powered independently of the other; and
   said array further comprising power control circuitry for controlling power supplied to said two power source inputs of each of said cells, wherein each of said cells comprise two high voltage level power source inputs and a single low voltage level power source input, said power control circuitry is configured to independently control a high voltage level input to each of said two high voltage level power source inputs and to supply a low voltage input to said low voltage power source input, said power control circuitry, in response to powering up the memory, is configured to provide a high voltage level signal to one of said power source inputs of each of said cells before the other one of said power source inputs, such that each cell is initialized to store a predetermined known value dependent upon which power source input received said high voltage level first.

2. A memory according to claim 1, wherein each of said semiconductor memory storage cells comprises a six transistor bit cell in which said two devices comprise a pair of back to back inverters each inverter comprising two transistors, and each of said memory storage cells further comprises two access control transistors arranged to selectively isolate each of said devices from said data input and output.

3. A memory according to claim 1, wherein said power control circuitry comprises logic for supplying one of two values of a high voltage level to each of said two independently controllable high voltage level inputs, said two values comprising either a higher high voltage level or a lower high voltage level.

4. A memory according to claim 1, said array of cells comprising a plurality of columns and rows of cells, said memory further comprising two independently controllable high voltage tracks for each column, each controllable by said power control circuitry and each connecting to each cell in said column and a low voltage track for each row and connecting to each cell in said row.

5. A memory according to claim 4, said memory comprising an SRAM memory array each row in said memory being separately addressable as a word.

6. A memory according to claim 3, wherein said power control circuitry is responsive to a read data signal received at said memory to supply said higher high voltage level to each of said power source inputs of said cell being addressed.

7. A memory according to claim 3, wherein said power control circuitry is responsive to a write high value signal to supply to said cell being addressed, said higher high voltage level to said power source input powering said device storing and outputting said high value and to supply said lower high voltage level to said power source input powering said device storing and outputting said low value.

8. A memory according to claim 3, wherein said power control circuitry is responsive to a write low value signal to supply to said cell being addressed, said lower high voltage level to said power source input powering said device storing and outputting said low value and to supply said higher high voltage level to said power source input powering said device storing and outputting said high value.

9. A memory according to claim 3, wherein said power control circuitry comprises gate controlled logic for providing said lower and higher high voltage levels to respective ones of said two devices.

10. A memory according to claim 9, wherein said power control circuitry comprises logic for connecting a high voltage level power supply to said power source input via a low resistance device to provide said higher high voltage level and for connecting said high voltage level power supply to said power source input via a higher resistance device to supply said lower high voltage level.

11. A method of writing data to an integrated circuit memory cell and reading data from said memory cell, said method comprising the steps of: connecting two power supply inputs via power supply control circuitry to said memory cell having two devices, such that a first device is controlled by a first power supply input and a second device by a second power supply input; independently controlling said two power supply inputs in response to receipt of data access signals, wherein, in response to powering up said memory cell, power is supplied to one of said two power supply inputs before the other of said two power supply inputs.

12. A method according to claim 11, wherein said two supply inputs are independently controlled such that:
   in response to a read signal said two devices are powered by a high power signal;
   in response to a write low value signal said first device is powered by a lower power signal and said second device by a high power signal;
   in response to a write high value signal said second device is powered by a lower power signal and said first device by a high power signal.

13. A memory comprising an array of semiconductor memory storage cells each storage cell comprising:
   a feedback loop comprising two devices for storing opposite binary values;
   data input and output for inputting data to and outputting data from said two devices;
   each of said two devices comprising a power source input, such that each device can be powered independently of the other;

said array further comprising power control circuitry for controlling power supplied to said two power source inputs of each of said cells; wherein:

each of said cells comprise two high voltage level power source inputs and a single low voltage level power source input, said power control circuitry configured to independently control a high voltage level input to each of said two high voltage level power source inputs and to supply a low voltage level input to said low voltage power source input; and said power control circuitry comprises logic for supplying one of two values of a high voltage level to each of said two independently controllable high voltage level inputs, said two values comprising either a higher high voltage level or a lower high voltage level; and said power control circuitry comprises source controlled logic for providing said lower and higher high voltage levels to respective ones of said two devices.

14. A memory according to claim 13, wherein said power control circuitry comprises logic for connecting a data write signal or an inverse data write signal to said power source input to provide said higher high voltage level and a diode connected device for connecting said high voltage power supply to said power source input to supply said lower high voltage level.

15. A method of writing data to an integrated circuit memory cell and reading data from said memory cell, said method comprising the steps of:

connecting two power supply inputs via power supply control circuitry to said memory cell having two devices, such that a first device is controlled by a first power supply input and a second device by a second power supply input;

independently controlling said two power supply inputs in response to receipt of data access signals;

wherein the memory cell comprises two high voltage level power source inputs and a single low voltage level power source input, a high voltage level input being independently controlled to each of said two high voltage level inputs and a low voltage level input being supplied to said low voltage power source input;

one of two values of a high voltage level is supplied to each of said two independently controllable high voltage level power source inputs, said two values comprising either a higher high voltage level or a lower high voltage level; and the supply of the lower and higher high voltage levels to respective ones of said two devices is controlled by source controlled logic.

* * * * *